United States Patent

[11] 3,585,469

[72] Inventors Hans Jäger
Heilbronn(Neckar);
Wolodimir Kosak, Talheim, both of, Germany
[21] Appl. No. 738,608
[22] Filed June 20, 1968
[45] Patented June 15, 1971
[73] Assignee Telefunken Patentverwertungsgesellschaft m.b.H
Ulm Danube, Germany
[32] Priority June 22, 1967, Feb. 24, 1968
[33] Germany
[31] T 34153 and T 35934

[54] SCHOTTKY BARRIER SEMICONDUCTOR DEVICE
6 Claims, 7 Drawing Figs.

[52] U.S. Cl. .................... 317/234, 148/1.5
[51] Int. Cl. .................... H01l 9/00
[50] Field of Search .................... 317/234.7, 234.5, 235.31, 235.30

[56] References Cited

UNITED STATES PATENTS

| | | | |
|---|---|---|---|
| 3,185,935 | 5/1965 | White | 317/235 |
| 3,265,542 | 8/1966 | Hirshon | 317/235 |
| 3,339,274 | 9/1967 | Saia et al. | 317/234 |
| 3,432,778 | 3/1969 | Ertel | 317/235 |

OTHER REFERENCES

IEEE TRANSACTIONS ON ELECTRON DEVICES, " Limitation of MOS Capacitance Method..." by Zaininger July 1965, Pages 179 and 192 relied on.

*Primary Examiner*—Jerry D. Craig
*Attorney*—Spencer & Kaye

ABSTRACT: A schottky-barrier diode and a method of making the same. The diode has a surface-type metal contact arranged on a semiconductor body forming a rectifying metal-semiconductor junction. The outer edge of the contact terminates abruptly and the rim portion of the contact tapers toward the outer edge.

Inventors:
Hans Jäger
Wolodimir Kosak
By: Spencer & Kaye
Attorneys

Inventors:
Hans Jäger
Wolodimir Kosak
By: Spencer & Kaye
Attorneys

SCHOTTKY BARRIER SEMICONDUCTOR DEVICE

BACKGROUND OF THE INVENTION

The present invention relates to a semiconductor device having at least one metal contact applied to the surface of a semiconductor body, forming a rectifying metal-to-semiconductor junction. More particularly, the present invention relates to a Schottky or surface-barrier diode.

If rectifying metal contacts are vaporized onto a semiconductor body through openings of constant cross section in a single-layer mask applied adhesively to the semiconductor body surface, the resulting diode will exhibit an extremely small blocking or breakdown voltage. If, on the other hand, the metal contacts are vaporized onto an uncoated semiconductor surface through an aperture mask spaced a given distance away from the semiconductor surface, the Schottky-barrier diode so produced will exhibit high blocking voltages but will be able to withstand, without destruction, a maximum inverse current of only about 1 ma.

SUMMARY OF THE INVENTION

An object of the present invention, therefore, is to provide a Schottky-barrier diode, and a method for making the same, which combines the advantages of the Schottky-barrier diodes made according to various methods of the prior art, described above. In particular, it is an object of the present invention to provide a Schottky-barrier diode which can withstand, without permanent damage, an inverse current in the breakdown region that is many times greater than the maximum inverse current of the Schottky-barrier diodes which are manufactured by depositing the metal contacts on the semiconductor body surface through an aperture mask spaced away from the surface. The breakdowns voltage of the Schottky-barrier diodes according to the present invention is nearly equal to the breakdown voltage of the above described Schottky-barrier diodes.

These, as well as other objects which will become apparent in the discussion that follows, are achieved, according to the present invention, by constructing the metal contact of the Schottky-barrier diode with an abruptly terminated outer edge and a rim portion which tapers toward the outer edge. This configuration can be produced, according to the method of the present invention, by applying a masking layer to the surface of a semiconductor body, forming an opening in the masking layer having a larger cross section in the region adjacent to the semiconductor body than in the region at the outer surface of the layer and vaporizing the Schottky contact onto the semiconductor body surface through this opening.

In a preferred embodiment of this method according to the present invention, the masking layer is formed of two laminated insulating layers of different material. If the first insulating layer, arranged directly on the semiconductor body surface, is made of a material which dissolves considerably more rapidly in an etching agent than the material forming the second insulating layer, arranged on the surface of this first layer, the larger cross section portion of the opening in the masking layer can be produced by etching away the first layer in the region beneath the second layer.

The Schottky-barrier diode produced and constructed according to the present invention can withstand a high inverse current in the breakdown region and exhibits a high breakdown voltage These favorable electrical characteristics are derived from the tapered, yet sharply bounded rim portion of the Schottky metal contact. The term "rim portion" as used throughout the instant specification and claims is intended to designate the metal corona or projecting edge which surrounds the body of the Schottky metal contact and which is formed by the dispersion of the vapor when the metal contact is deposited onto the semiconductor body surface through the mask opening of larger cross section directly adjacent to the semiconductor body surface than at the outer surface of the layer.

The advantage of the shape of the metal contact according to the present invention is based on the fact that the height of the breakdown voltage of Schottky-barrier diodes depends on the size of the metal corona—that is, the lateral extent of the tapered rim portion—of the Schottky contact. It is important, therefore, that the Schottky contact consist of a metal layer having a rim portion which tapers toward its outer edge and a remaining portion of substantially constant cross section. It has been discovered, in addition, that the inverse current of a Schottky-barrier diode can be considerably increased if the outer edge of the metal rim portion or corona which is formed by the dispersion of the metal atoms, when vaporized through the mask opening, is sharply and abruptly bounded. Since the areal extent of the flattened rim portion or corona of the metal contact can be determined by the degree with which the masking layer is underetched in the region of the semiconductor surface, it is possible to control the resulting breakdown voltage and the maximum inverse current of the Schottky-barrier diode, for example, by the choice of the insulating materials used for the two laminally arranged insulating layers in relation to their etching rates in a particular etching agent and by the choice of the etching time. With an increase in the underetching—that is, an increase in the difference in cross section between the region of the opening adjacent to the semiconductor body and the region thereof at the outer surface of the masking layer—the breakdown voltage and the maximum inverse current will increase and decrease, respectively.

If a deposition mask made of two separate insulating layers is employed, in accordance with the present invention, to produce the Schottky contact, these layers should consist of substances which have widely different rates of solution in a given solvent. This condition is met, for example, if silicon dioxide and silicon oxide are used as the substances and buffered hydrofluoric acid is employed as the solvent. Since silicon dioxide dissolves in hydrofluoric acid approximately 10 times faster than silicon oxide, the process according to the present invention may be effectively carried out if the insulating layer next to the semiconductor body surface is made of silicon dioxide and the outer layer of silicon oxide. The vaporization opening having the desired cross-sectional configuration can then be etched in the layers with the hydrofluoric acid.

DESCRIPTION OF THE PREFERRED EMBODIMENTS

Figure 1:
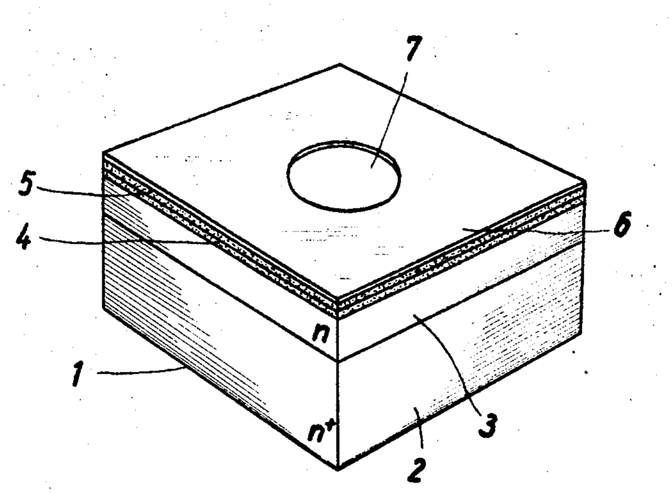
FIG. 1 is a perspective view of the semiconductor device of FIG. 2 in an initial stage of manufacture.

Referring now to the drawings, FIGS. 1 and 2 and FIGS. 3—7 provide cross-sectional illustrations of two preferred methods which may be employed to produce the Schottky-barrier diode according to the present invention.

FIG. 1 shows a silicon semiconductor body 1 comprised of an $n^+$-conductive substrate layer 2 and an epitaxially produced $n$-conductive layer 3 arranged thereon. The surface of the semiconductor body 1 is initially subjected to a cleansing treatment. An insulating silicon dioxide layer ($SiO_2$) 4 is thereafter applied to the semiconductor surface by pyrolytic deposition; preferably to a thickness of approximately 0.1 to 0.5 $\mu$m. (1$\mu$m.=[16] meter).

An additional insulating layer 5 comprised of silicon oxide (SiO) is then evaporated onto the silicon dioxide layer 4. This additional layer may, for example, have a thickness of approximately 0.3 to 1 $\mu$m. The silicon oxide layer is finally covered with a photoresist layer 6 which, in turn, is illuminated so that a suitable solvent will be able to remove a portion thereof, such as the circular portion 7 shown in FIG. 1.

The semiconductor body prepared in the manner described above can then be immersed in buffered hydrofluoric acid to remove the portion of the silicon oxide layer 5 not covered by the photoresist layer 6.

Figure 2:
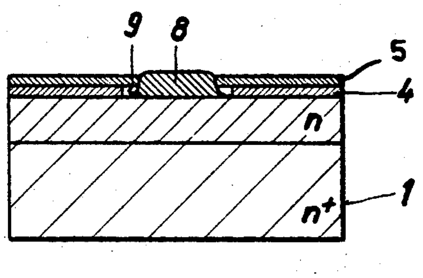
FIG. 2 is a cross-sectional view of a semiconductor device, according to a preferred embodiment of the present invention, produced according to one preferred method of the present invention.

After this portion of the SiO-layer is removed, the exposed portion of the silicon dioxide layer 4 will be quickly eroded. Since $SiO_2$ dissolves much faster in hydrofluoric acid than does SiO, the silicon dioxide layer will be also etched away beneath the edges of the opening formed by the silicon oxide layer and the photoresist mask. If the etching process is then terminated at the proper moment, a deposition mask will be obtained having an opening of widening cross section in the direction of the semiconductor body surface, as shown in FIG. 2.

A metal coating 8 is subsequently vaporized in vacuum through this opening in the deposition mask onto the semiconductor body surface to form a rectifying contact with the *n*-doped semiconductor material. Examples of metals which are suitable for this purpose are gold, silver, platinum and palladium. The metal coating which is precipitated on the silicon oxide layer may then be removed with the aid of an adhesive foil.

Because of the increase in the cross section of the opening of the deposition mask in the direction of the semiconductor surface, some of the vaporized metal will be deposited in the region etched away beneath the silicon oxide layer 5 and will form a rim portion 9 of the contact 8 which tapers toward its outer edge. The remainder of the contact 8 which lies within the opening in the silicon oxide layer 5 will have a uniform thickness.

Since the metal rim or corona 9 is terminated abruptly by the cross-sectional limits of the underetched portion of the opening in the silicon dioxide layer 4, the resulting Schottky-barrier diode will have a low capacitance and a very small inverse current. The existence of the metal corona surrounding the Schottky metal contact results in a Schottky-barrier diode with a high breakdown voltage.

If the metal contact 8 is formed with a thickness that is greater than the thickness of the silicon dioxide layer 4, the sensitive boundary layer between the semiconductor body 1 and the contact 8 will be hermetically sealed by the silicon oxide layers. This construction can thus prevent outside impurities from impairing the electrical characteristics of the Schottky-barrier diode and increase its useful life.

Figure 7:
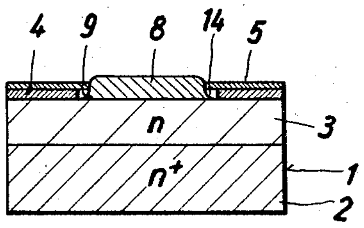
FIG. 7 is a cross-sectional view of a semiconductor device, according to a preferred embodiment of the present invention, produced according to a second preferred method of the present invention.

A second preferred method of making the Schottky-barrier diode according to the present invention will now be described in connection with FIGS. 3 and 7, which illustrate the various stages of manufacture in cross section.

Figure 3:
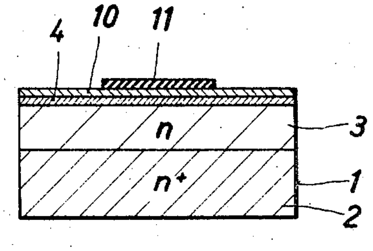
FIG. 3 is a cross-sectional view of the semiconductor device of FIG. 7 in a first stage of manufacture.

FIG. 3 shows a section of another silicon semiconductor body 1 comprised of an $n^+$*-conductive substrate layer 2 and an epitaxially produced n*-conductive layer 3 arranged thereon. On the surface of this semiconductor body is applied an insulating, 0.5 $\mu$m.-thick silicon dioxide ($SiO_2$) layer 4. This first insulating layer is subsequently covered with a metal layer 10 of nickel or aluminum, preferably with a thickness of 1 to 2 $\mu$m. The aluminum or nickel may, for example, be vaporized onto the $SiO_2$ layer at 100° C or 150° C, respectively.

The metal layer is next coated with a photoresist layer which is illuminated and developed, leaving a photoresist spot 11, the size of the Schottky contact to be produced, on the metal layer. This spot 11 may, for example, be centered with respect to the semiconductor body 1.

The portion of the metal layer 10 which is not covered and protected by the photoresist spot is subsequently removed with a suitable etching solution. For aluminum an etching agent, for example, of phosphoric acid or a solution of $(NH_4)$ $S_2O_4$, water and concentrated hydrofluoric acid may be used. For nickel, on the other hand, it is possible to employ a solution of one part ferrous trichloride ($FeCl_3$) and 15 parts water or a solution of concentrated nitric acid, glacial acetic acid and water.

When the metal layer is etched with one of the designated solutions, the remaining metal spot beneath the photoresist layer will have sharply defined right-angled edges. These edges will prove very advantageous in subsequent steps of the method according to the present invention.

Figure 4:
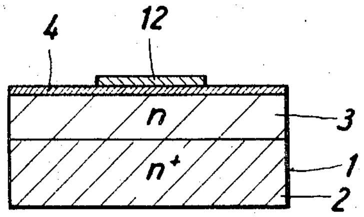
FIG. 4 is a cross-sectional view of the semiconductor device of FIG. 7 in a second stage of manufacture.
Figure 5:
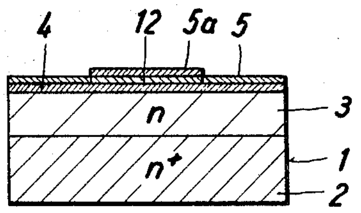
FIG. 5 is a cross-sectional view of the semiconductor device of FIG. 7 in a third stage of manufacture.

When the photoresist spot 11 is next removed, there will remain a metal spot 12 which, for example, may be circular in shape and centrally arranged on the silicon dioxide layer 4, as shown in FIG. 4. A silicon oxide layer with a thickness of approximately 0.5 to 1.5 $\mu$m. is subsequently vaporized onto the silicon dioxide layer 4 and the metal spot 12, as shown in FIG. 5. The silicon oxide layer is preferably always thinner than the metal layer; the difference between the thickness of the two may, for example, lie in the range of 0.1 to 0.5 $\mu$m. If these dimensions are maintained, there will be a discontinuity between the silicon oxide layers 5 and **5*a* on the silicon dioxide layer 4 and the metal spot 12, respectively, at the edge of the metal spot 12**.

The metal spot 12, together with the portion **5*a* of the silicon oxide layer located thereon, is next removed with the aid of one of the etching agents designated above. The resulting structure, as shown in FIG. 6, will consist of a semiconductor body covered on one surface with a continuous silicon dioxide layer 4 which, in turn, is covered with a silicon oxide layer 5 having an opening 13**.

Figure 6:
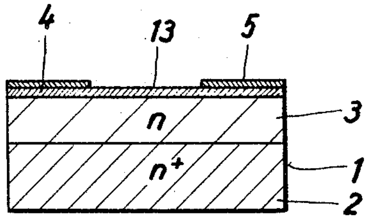
FIG. 6 is a cross-sectional view of the semiconductor device of FIG. 7 in a fourth stage of manufacture.

If the semiconductor device shown in FIG. 6 is now subjected to a further etching treatment in buffered hydrofluoric acid, the portion of the silicon dioxide layer 4 exposed by the opening 13 and immediately beneath the silicon oxide layer 5 at the edges of the opening will be quickly etched away since, though silicon dioxide is quickly dissolved, silicon oxide is practically inert to this etching agent. The etching time is therefore a measurement of the amount of silicon dioxide material which will be removed from beneath the silicon oxide layer 5 in the area designated in FIG. 7 with the numeral 14.

A metal contact 8 is finally vaporized in vacuum onto the semiconductor surface through the opening in the two insulating layers 4 and 5. As the result of dispersion of the vaporized metal, the contact 8 will be provided with a metal corona 9 in the space 14 below the edge of the silicon oxide layer opening. The edge of this corona 9 will be sharply bounded by the edge of the opening formed by the silicon dioxide layer 4.

In addition to producing Schottky-barrier diodes with high breakdown voltages, the method according to the present invention has the important advantage that it allows the breakdown voltages to be controlled.

It is to be understood that other insulating layers may be employed in place of silicon oxide and silicon dioxide in the construction of a deposition mask for the metal semiconductor contact. The manufacturing processes described above are also not limited to the use of *n*-doped silicon semiconductor bodies. It is possible, rather, to employ *p*-doped silicon semiconductor bodies or other semiconductor materials with any desired doping.

It will be understood that the above description of the present invention is susceptible to various modifications, changes and adaptations, and the same are intended to be comprehended within the meaning and range of equivalents of the appended claims

We claim:

1. In a Schottky barrier diode having a surface-type metal contact on a semiconductor body forming a rectifying metal-semiconductor junction, the improvement wherein the outer edge of said metal contact terminates abruptly and said contact has a rim portion which tapers toward said outer edge so that said diode has an increased breakdown voltage and is capable of withstanding increased inverse currents in the breakdown region.

2. The improvement defined in claim 2, further comprising a masking layer of insulating material arranged on the surface of said semiconductor body on the side of said body which is contacted by said metal contact, said masking layer covering the portion of said surface not covered by said metal contact and extending over said rim portion of said metal contact.

3. The improvement defined in claim 2 wherein said masking layer comprises two insulating layers arranged one on the other and made of different materials, the material forming the first insulating layer arranged in direct contact with said surface being more readily dissolvable in an etching solution than the material forming the second insulating layer arranged on said first insulating layer.

4. The improvement defined in claim 3 wherein said semiconductor body is made of silicon, said first insulating layer is made of silicon dioxide and said second insulating layer is made of silicon oxide, and wherein said second insulating layer extends over said rim portion of said metal contact.

5. The improvement defined in claim 4 wherein said first insulating layer has a thickness in the range of 0.1 to 0.5 $\mu$m. and said second insulating layer has a thickness in the range of 0.3 to 1 $\mu$m.

6. The improvement defined in claim 1 wherein said semiconductor body is $n$-conductive and said metal contact is made of a material selected from the group consisting of gold, silver, platinum and palladium.